(12) United States Patent
Yang et al.

(10) Patent No.: US 9,006,095 B2
(45) Date of Patent: Apr. 14, 2015

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Shin-Yi Yang, New Taipei (TW); Ming Han Lee, Taipei (TW); Hsiang-Huan Lee, Jhudong Township (TW); Hsien-Chang Wu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/770,932

(22) Filed: Feb. 19, 2013

(65) Prior Publication Data

US 2014/0235049 A1    Aug. 21, 2014

(51) Int. Cl.
*H01L 21/44* (2006.01)
*H01L 21/768* (2006.01)

(52) U.S. Cl.
CPC ....... *H01L 21/76838* (2013.01); *Y10S 977/734* (2013.01)

(58) Field of Classification Search
CPC ............. H01L 21/76838; H01L 51/0045; H01L 51/0048; H01L 29/0669
USPC .......................... 438/610, 622, 627
See application file for complete search history.

(56) References Cited

U.S. PATENT DOCUMENTS 7,473,633 B2 * 1/2009 Furukawa et al. ............ 438/622
2012/0006580 A1 * 1/2012 Sandhu ...................... 174/126.1

OTHER PUBLICATIONS

Kim et al., Out-of-plane growth of CNTs on the graphene for supercapacitor applications, 2012, Nanotechnology 23 (2012) 015301.*
Hiramatsu et al., Nucleation Control of Carbon Nanowalls using Inductively Coupled Plasma-Enhanced Chemical Vapor Deposition, Published Jan. 21, 2013 (6 pages), Japanese Journal of Applied Physics, 52 (2013) 01AK05.*
Kim (Keun Soo) et al. 'Large-scale pattern growth of graphene films for stretchable transparent electrodes'—2009, Nature, vol. 457/5 (2009), 706-710.*
Rout et al.—Synthesis of Chemically Bonded CNT-graphene Heterostructure Arrays, 2012, RSC Advances, 2012, 2, 8250-8253.*
Zhu et al., Assembling Carbon Nanotube Bundles Using Transfer Process for Fine Pitch Electrical Interconnect Applications, 2007 Electronic Components and Technology Conference, 1981-1983.*

(Continued)

*Primary Examiner* — Reema Patel
*Assistant Examiner* — Syed Gheyas
(74) *Attorney, Agent, or Firm* — Slater & Matsil, L.L.P.

(57) ABSTRACT

Semiconductor devices and methods of manufacture thereof are disclosed. In one embodiment, a method of manufacturing a semiconductor device includes providing a workpiece including a conductive feature formed in a first insulating material and a second insulating material disposed over the first insulating material. The second insulating material has an opening over the conductive feature. The method includes forming a graphene-based conductive layer over an exposed top surface of the conductive feature within the opening in the second conductive material, and forming a carbon-based adhesive layer over sidewalls of the opening in the second insulating material. A carbon nano-tube (CNT) is formed in the patterned second insulating material over the graphene-based conductive layer and the carbon-based adhesive layer.

20 Claims, 10 Drawing Sheets

(56) References Cited

OTHER PUBLICATIONS

Bhaviripudi, S., et al., "Role of Kinetic Factors in Chemical Vapor Deposition Synthesis of Uniform Large Area Graphene Using Copper Catalyst," 2010 American Chemical Society, Nano Lett. 2010, 10, pp. 4128-4133.

Dijon, J., et al., "Ultra-high density Carbon Nanotubes on Al—Cu for advanced Vias", 2010 IEEE IEDM, pp. 33.4.1-33.4.4.

Naeemi, A., et al., "Conductance Modeling for Graphene Nanoribbon (GNR) Interconnects," IEEE Electron Device Letters, vol. 28, No. 5, May 2007, pp. 428-431.

Portet, C., et al., "Modification of Al Current Collector/Active Material Interface for Power Improvement of Electrochemical Capacitor Electrodes," Journal of the Electrochemical Society, 153 (4) A649-A653 (2006), 6 pages.

Stoller, M.D., et al., "Graphene-Based Ultracapacitors," American Chemical Society, Nano Lett. 2008, vol. 8, No. 10, pp. 3498-3502.

Tung, V.C., et al., "Low-Temperature Solution Processing of Graphene-Carbon Nanotube Hybrid Materials for High-Performance Transparent Conductors," American Chemical Society, Nano Lett. 2009, vol. 9, No. 5, pp. 1949-1955.

Wang, Y., et al., "Supercapacitor Devices Based on Graphene Materials," J. Phys. Chem. C 2009, 113, pp. 13103-13107.

Xue, Y., et al., "Low Temperature Growth of Highly Nitrogen-Doped Single Crystal Graphene Arrays by Chemical Vapor Deposition," Journal of the American Chemical Society 2012, pp. 11060-11063.

Zhu, L, et al., "Assembling Carbon Nanotube Bundles Using Transfer Process for Fine-Pitch Electrical Interconnect Applications," 2007 Electronic Components and Technology Conference, IEEE, pp. 1981-1985.

* cited by examiner

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to semiconductor devices and methods of manufacture thereof. Novel semiconductor devices having carbon nano-tubes (CNT's) as via interconnects will be described herein.

Figure 1:
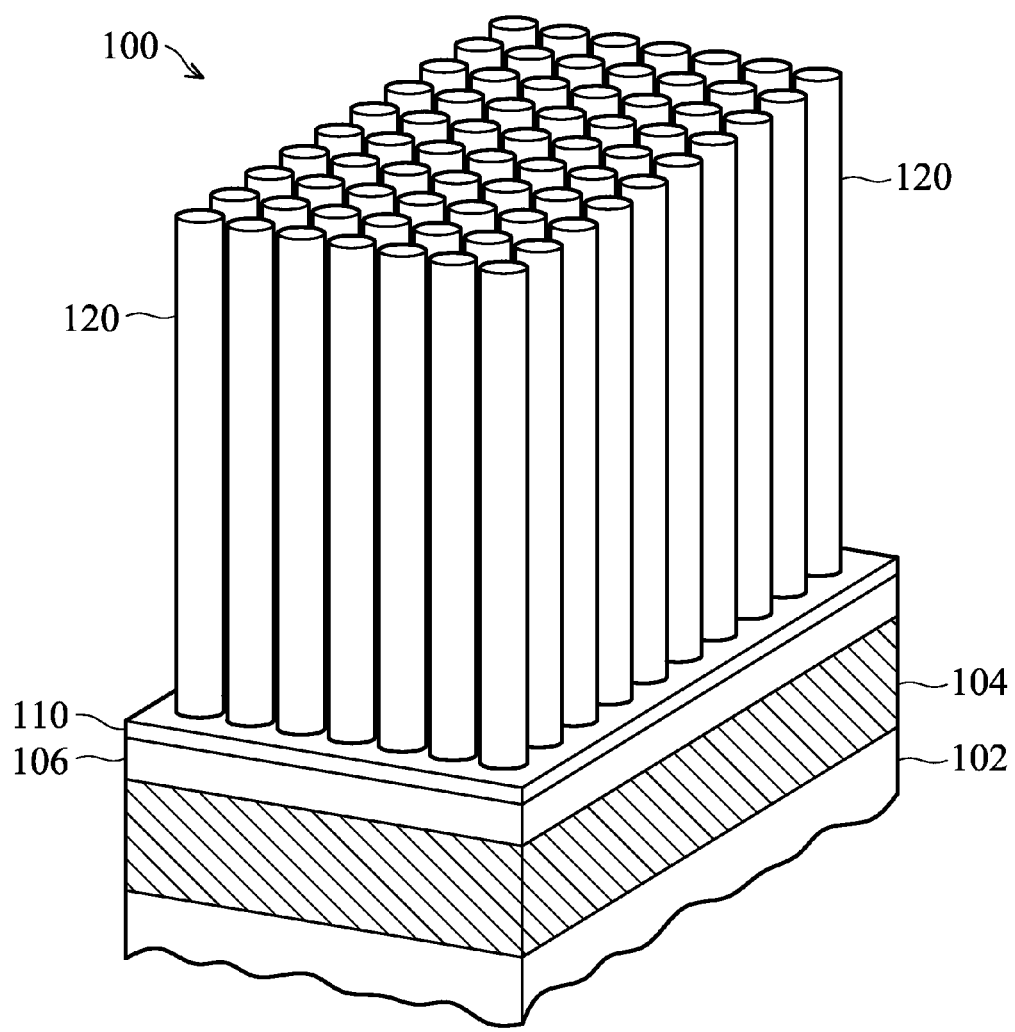
FIG. 1 is a perspective view of a semiconductor device including a plurality of carbon nano-tubes (CNT's) in accordance with some embodiments of the present disclosure.

FIG. 1 is a perspective view of a semiconductor device 100 including a plurality of CNT's 120 in accordance with some embodiments of the present disclosure. The semiconductor device 100 includes a workpiece 102 and an insulating material 104 disposed over the workpiece 102. A conductive feature 106 is formed over a portion of the insulating material 104 in accordance with some embodiments. The conductive feature 106 is formed within an entire thickness of the insulating material 104 in other embodiments. A graphene-based conductive layer 110 is disposed over at least a portion of the conductive feature 106. A plurality of CNT's 120 are formed over the graphene-based conductive layer 110 within an insulating material (not shown in FIG. 1; see insulating material 114 shown in FIG. 8). Embodiments of the present disclosure include novel methods of forming the graphene-based conductive layer 110, forming a carbon-based adhesive layer over sidewalls of openings in the insulating material 114 (also not shown in FIG. 1; see carbon-based adhesive layer 112 shown in FIG. 8), and forming the CNT's 120, to be described further herein.

Figure 2:
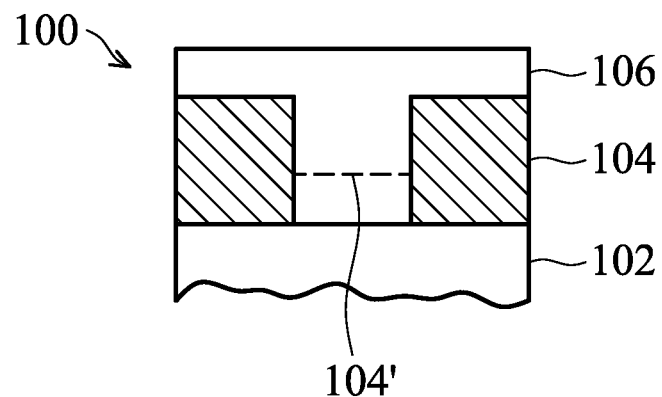
FIGS. 2 through 6 are cross-sectional views of a method of manufacturing a semiconductor device at various stages of manufacturing in accordance with some embodiments.

FIGS. 2 through 6 are cross-sectional views of a method of manufacturing a semiconductor device 100 at various stages of manufacturing in accordance with some embodiments. To manufacture the semiconductor device 100, first, a workpiece 102 is provided, as shown in FIG. 2. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A first insulating material 104 is formed over the workpiece 102, also shown in FIG. 2. The first insulating material 104 may comprise silicon dioxide, silicon nitride, other insulating materials, or combinations or multiple layers thereof, as examples. In some embodiments, the first insulating material 104 comprises a low dielectric constant (k) insulating material having a dielectric constant or k value less than a dielectric constant of silicon dioxide, which is about 3.9. In other embodiments, the first insulating material 104 comprises an extra low-k (ELK) insulating material having a k value of about 2.5 or less. Alternatively, the first insulating material 104 may comprise other materials and may comprise other k values. The first insulating material 104 comprises a thickness of about 0.1 nm to about 20 nm, although alternatively, the first insulating material 104 may comprise other dimensions. The first insulating material 104 may be formed or deposited using chemical vapor deposition (CVD), plasma enhanced CVD (PECVD), or combinations thereof, as examples. Alternatively, other methods can be used to form the first insulating material 104. In some embodiments, the first insulating material 104 comprises a via level inter-metal dielectric (IMD), for example.

A damascene process for forming conductive features 106 within the first insulating material 104 will next be described. The first insulating material 104 is patterned using lithography with a pattern for a conductive feature. For example, a layer of photoresist (not shown) may be formed over the first insulating material 104, and the layer of photoresist is patterned by exposure to energy transmitted through or reflected from a lithography mask having a desired pattern disposed thereon. The layer of photoresist is developed, and exposed (or unexposed, depending on whether the layer of photoresist comprises a negative or positive photoresist) are removed using an etching and/or ashing process. The layer of photoresist is then used as an etch mask to etch away portions of the first insulating material 104, forming the pattern for the conductive feature 106 within the first insulating material 104. In some embodiments, only a top portion of the first insulating material 104 is patterned or removed, as shown in phantom (e.g., in dashed lines) at 104' in FIG. 2.

A conductive material 106 is formed over the patterned first insulating material 104, also shown in FIG. 2. The conductive material 106 comprises Cu, Fe, Co, Ni, alloys thereof, or combinations or multiple layers thereof in some embodiments. Alternatively, the conductive material 106 may comprise other materials. The conductive material 106 fills the pattern in the first insulating material 104 and also covers the top surface of the first insulating material 104. The conductive material 106 may be formed using CVD, physical vapor deposition (PVD), electrochemical plating (ECP), electroless plating, combinations thereof, or other methods.

Figure 3:
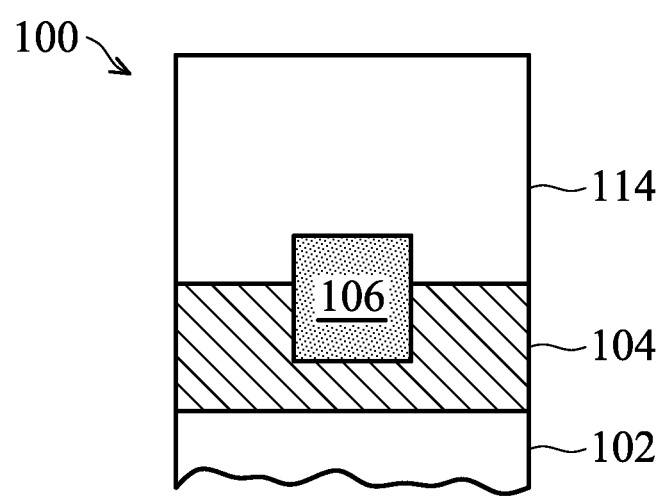

A chemical-mechanical polishing (CMP) process and/or etch process is used to remove the conductive material 106 from over the top surface of the insulating material 104, as shown in FIG. 3, leaving the conductive feature 106 disposed within the insulating material 104. The conductive feature 106 comprises a conductive line in some embodiments that extends in and out of the paper in the view shown by a predetermined distance. The conductive feature 106 may alternatively comprise a conductive trace that has a meandering pattern. A top portion of the insulating material 104 may also be removed or recessed during the CMP process and/or etch process used to remove the conductive material 106 from the top surface of the insulating material 104, also shown in FIG. 3. Alternatively, the insulating material 104 may not be recessed, and the top surface of the conductive material 106 comprising the conductive feature 106 may be substantially co-planar with the top surface of the insulating material 104, not shown in the drawings.

Alternatively, the conductive feature 106 may be formed using a subtractive process, also not shown in the drawings. For example, the conductive material 106 may be formed over the workpiece 102, and the conductive material 106 is then patterned using a lithography process. The first insulating material 104 is formed over the conductive material 106, e.g., between adjacent conductive features 106. Only one conductive feature 106 is shown in some of the drawings; however, a plurality of conductive features 106 is formed across a surface of the workpiece 102 of the semiconductor device 100 in some embodiments (see FIG. 16).

Referring again to FIG. 3, a second insulating material 114 is formed over the conductive feature 106 and the first insulating material 104. The second insulating material 114 may comprise a similar material described for the first insulating material 104 and may be formed using similar methods described for the first insulating material 104. The second insulating material 114 comprises a thickness of about 1 nm to about 100 nm, although alternatively, the first insulating material 104 may comprise other dimensions.

Figure 4:
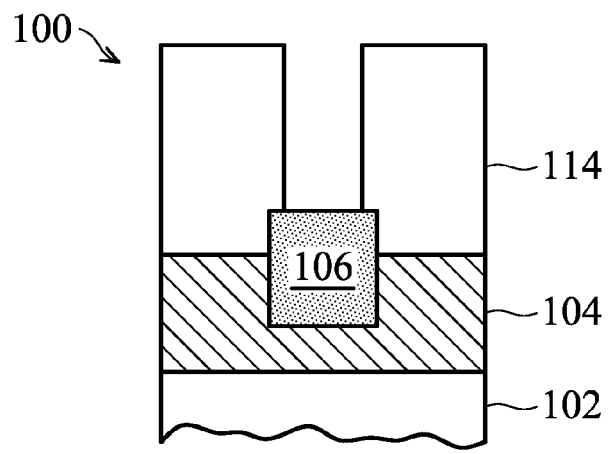

The second insulating material 114 is patterned using a lithography process, as shown in FIG. 4, forming an opening over at least a portion of the conductive feature 106 and exposing a top surface of the conductive material 106.

Figure 5:
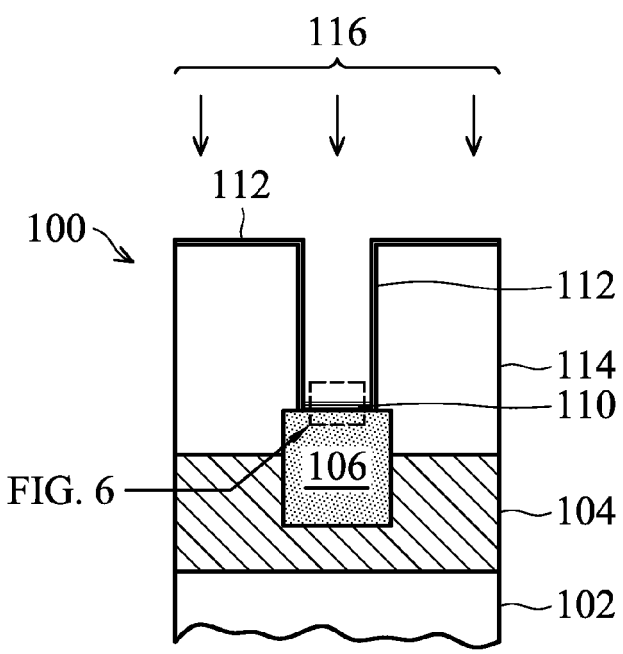

Next, a graphene-based conductive layer 110 is formed over the exposed top surface of the conductive feature 106 within the opening in the second insulating material 114, and a carbon-based adhesive layer 112 is formed over sidewalls of the opening in the second insulating material 114, as shown in FIG. 5. The graphene-based conductive layer 110 over the exposed top surface of the conductive feature 106 and the carbon-based adhesive layer 112 on sidewalls of the patterned second insulating material 114 are simultaneously formed in some embodiments. The carbon-based adhesive layer 112 is also formed on the top surface of the second insulating material 114 in some embodiments. The graphene-based conductive layer 110 and the carbon-based adhesive layer 112 are formed using a carbon deposition process 116 in some embodiments. The graphene-based conductive layer 110 and the carbon-based adhesive layer 112 are formed using a gas-phase growth process in some embodiments. The graphene-based conductive layer 110 and the carbon-based adhesive layer 112 are formed using CVD, atmospheric pressure CVD (APCVD), low-pressure CVD (LPCVD) at a sub-atmospheric pressure, PECVD, atomic layer CVD (ALCVD), or combinations thereof, as examples, in some embodiments. The graphene-based conductive layer 110 and the carbon-based adhesive layer 112 are formed using $CH_4+H_2+Ar$ in some embodiments. Alternatively, other methods may be used to form the graphene-based conductive layer 110 and the carbon-based adhesive layer 112.

Figure 6:
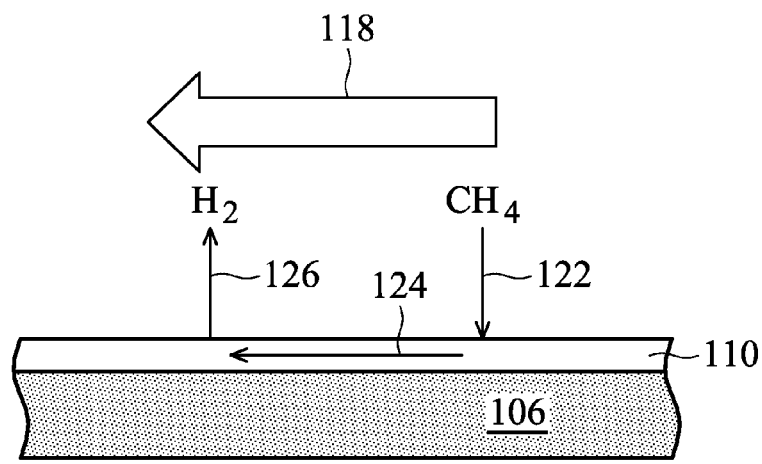

FIG. 6 is a more detailed cross-sectional view of a portion of the semiconductor device 100 shown in FIG. 5 proximate the top surface of the conductive feature 106. To form the graphene-based conductive layer 110, a gas flow 118 of $CH_4+H_2+Ar$ is introduced into a chamber that the semiconductor device 100 is being processed in. At time period 122, $CH_4$ diffuses (e.g., as a gas layer near the surface, in a reaction-control region) onto the top surface of the conductive feature 106 and reaches the top surface of the conductive feature 106. At time period 124, the C within the $CH_4$ becomes adsorbed onto the surface of the conductive feature 106, and the C molecules are decomposed to form active carbon species. The active carbon species are diffused onto the surface of the catalyst (e.g., the material of the conductive feature 106 comprising Cu, Fe, Co, Ni, alloys thereof, or combinations thereof), or the active carbon species are diffused into the catalyst close to the top surface of the conductive feature 106, to form a graphene lattice of a graphene sheet (GS) material. Inactive species, such as H, become desorbed from the surface and form molecular hydrogen. At time period 126, the molecular hydrogen ($H_2$) is diffused away from the top surface of the conductive feature 106 through the boundary layer and are swept away by the bulk gas flow 118.

Figure 7:
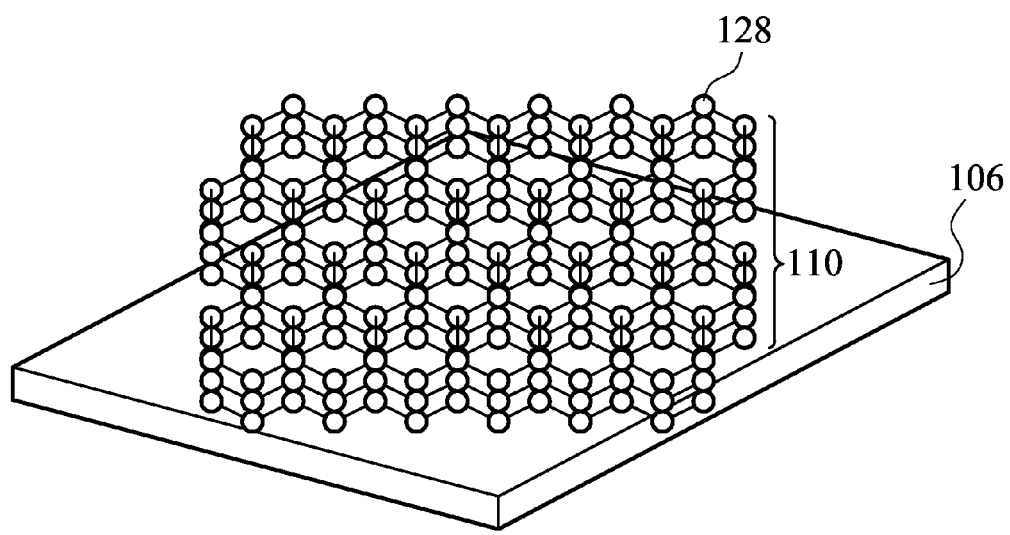
FIG. 7 is a perspective view of a graphene-based conductive layer comprising a plurality of graphene sheets (GS's) in accordance with some embodiments.

FIG. 7 is a perspective view of a graphene-based conductive layer 110 comprising a plurality of graphene sheets (GS's) 128 in accordance with some embodiments. The graphene-based conductive layer 110 comprises one or more graphene sheets 128 that are formed on the top surface of the conductive feature 106 in accordance with some embodiments, for example. The graphene-based conductive layer 110 comprises a few layers of graphene sheets 128 formed by selective growth in some embodiments, for example. The graphene sheets 128 are uniform and continuous, and are formed by layer-by-layer bottom-up growth in some embodiments. The graphene-based conductive layer 110 has a thickness of about 0.1 nm to about 20 nm, in some embodiments.

Alternatively, the graphene-based conductive layer 110 may comprise other materials and dimensions, and may be formed using other methods.

Simultaneous with the formation of the graphene sheets 128 of the graphene-based conductive layer 110, the carbon-based adhesive layer 112 (refer again to FIG. 5) is formed on the sidewalls of the pattern or opening in the second insulating material 114, due to the introduction of $CH_4+H_2+Ar$ to the semiconductor device 100. The carbon-based adhesive layer 112 comprises amorphous carbon having a thickness of about 0.1 nm to about 20 nm, in some embodiments. Alternatively, the carbon-based adhesive layer 112 may comprise other materials and dimensions.

Figure 8:
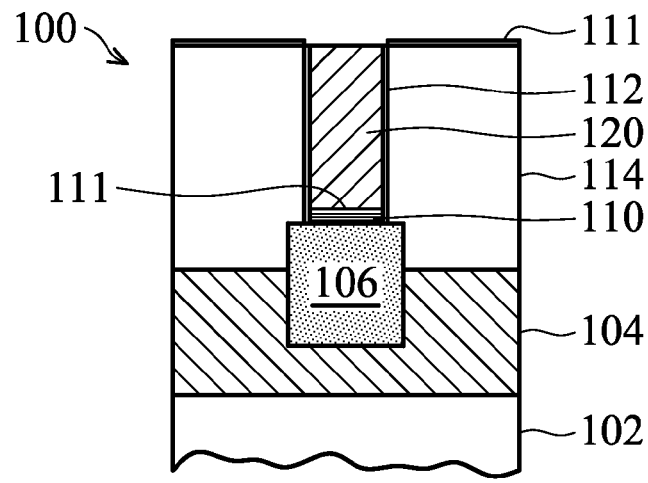
FIGS. 8 through 10 are cross-sectional views of a method of manufacturing a semiconductor device at various stages of manufacturing in accordance with some embodiments.
Figure 9:
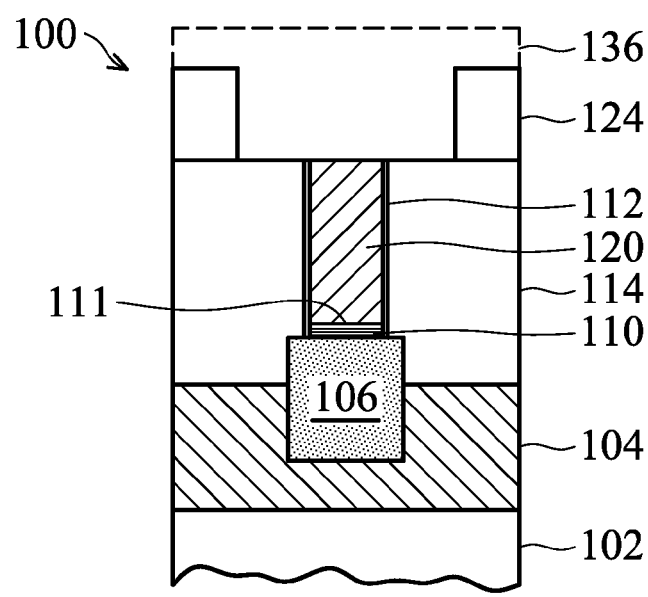
Figure 10:
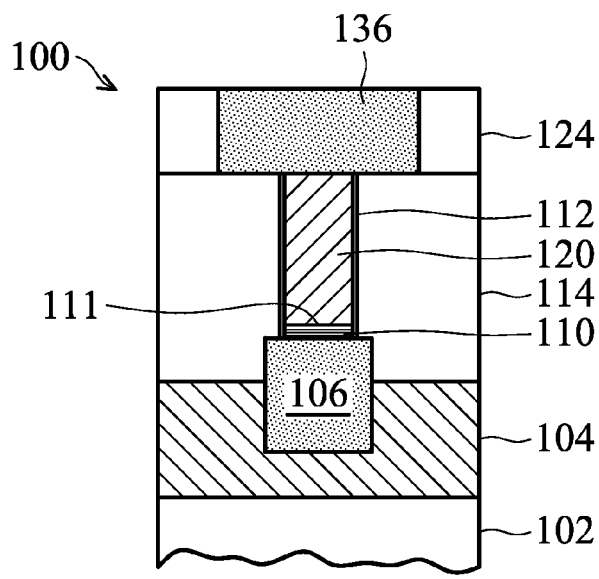

FIGS. 8 through 10 are cross-sectional views of a method of manufacturing a semiconductor device 100 at various stages of manufacturing in accordance with some embodiments, after the manufacturing steps shown in FIGS. 5, 6, and 7. A catalyst 111 is deposited over the graphene-based conductive layer 110, as shown in FIG. 8. The catalyst 111 comprises about 1 nm of a material such as Fe, although the catalyst 111 may alternatively comprise other materials and dimensions. The catalyst 111 is formed in the bottom surface of the pattern or opening in the second insulating material 114 and on the top surface of the second insulating material 114, but not on the sidewalls of the pattern or opening in the second insulating material 114. Carbon nano-tubes (CNT's) 120 are then grown over the catalyst 111 and over the graphene-based conductive layer 110, also shown in FIG. 8. The semiconductor device 100 is chemically-mechanically polished to remove excess CNT 120 material and the catalyst 111 from over the top surface of the second insulating material 114. The CNT's 120 may comprise dozens or hundreds of CNT's that extend through the thickness of the second insulating material 114. The CNT's 120 are conductive and comprise hollow tubes in some embodiments. The CNT's 120 comprise a via interconnect that is formed between an underlying conductive feature 106 and an overlying conductive feature 136 (see FIG. 10) in some embodiments. The graphene-based conductive layer 110 advantageously reduces a contact resistance of the CNT's 120 comprising the via interconnect in some embodiments.

The overlying conductive feature 136 is formed using a damascene process in some embodiments. A third insulating material 124 is formed over the CNT's 120 and the second insulating material 114, as shown in FIG. 9. The third insulating material 124 is patterned with a pattern for a conductive feature 136 that will be formed over the top surface of the CNT's 120 in some embodiments. A wet cleaning process is used to clean the semiconductor device 100 after the patterning of the third insulating material 124 in some embodiments. A conductive material 136, shown in phantom in FIG. 9, is deposited or formed over the third insulating material 124. A CMP process and/or etch process is used to remove excess conductive material 136 from over the top surface of the third insulating material 124, leaving a conductive feature 136 formed within the third insulating material 124 over the CNT's 120, as shown in FIG. 10. In some embodiments, an electro-chemical plating (ECP) process is used to form the conductive feature 136. A CMP process and/or etch process may not be required, in these embodiments. The conductive features 136 may also be formed using a subtractive etch process. The conductive feature 136 comprises a conductive line or trace in some embodiments, as described for conductive feature 106. A plurality of the conductive features 136 is formed over a surface of the semiconductor device 100 in some embodiments. The conductive feature 136 comprises Au, Ag, Al, Cu, Fe, Co, Ni, alloys thereof, or combinations or multiple layers thereof formed using a similar method described for conductive feature 106 in some embodiments, for example. Alternatively, the conductive feature 136 may comprise other materials and may be formed using other methods.

Referring again to FIG. 1, a perspective view of a plurality of groups of the CNT's 120 formed over the conductive feature 106 is shown. A plurality of patterns may be formed within the second insulating material 114 over the top surface of a single conductive feature 106, and a plurality of CNT's 120 is formed within each of the plurality of patterns. An array of the patterns for CNT's 120 may be formed over a single conductive feature 106, as illustrated in FIG. 1. The array of the CNT's 120 may comprise a square or rectangular shape in a top view of the semiconductor device 100, for example. The array may alternatively comprise other shapes in a top view, such as a circle, oval, trapezoid, or other shapes.

Figure 11:
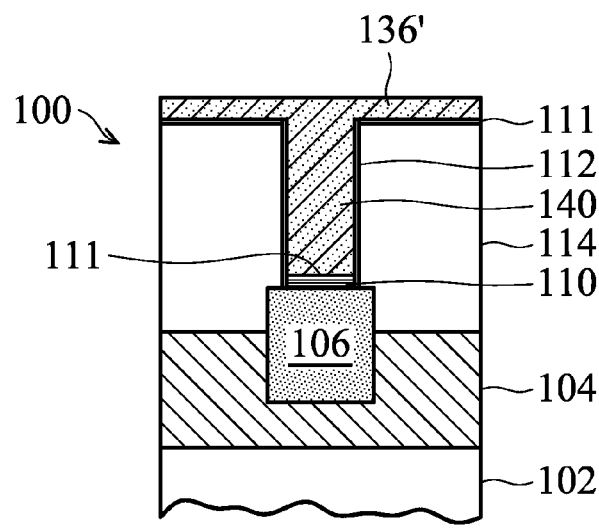
FIGS. 11 through 13 are cross-sectional views of a method of manufacturing a semiconductor device at various stages of manufacturing in accordance with some embodiments.
Figure 12:
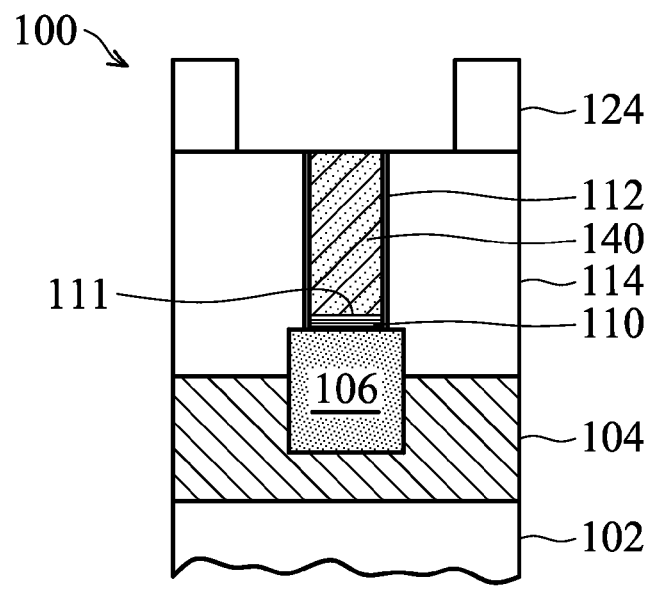
Figure 13:
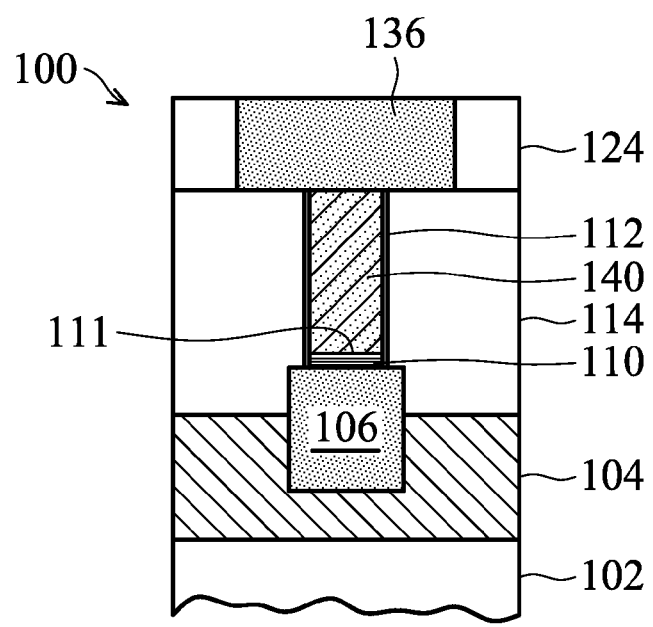

The interspaces of the CNT's 120 comprising hollow tubes are unfilled in the embodiment shown in FIG. 10. In other embodiments, the interspaces of the CNT's 120 are filled with a conductive material, such as a metal. The metal encapsulates the CNT's 120, for example. FIGS. 11 through 13 are cross-sectional views of a method of manufacturing a semiconductor device 100 at various stages of manufacturing in accordance with some embodiments of the present disclosure, wherein the CNT's 120 are encapsulated with a metal such as Cu or a Cu alloy, although other metals can be used. After the manufacturing process step shown in FIG. 8, a conductive material 136' comprising a metal is formed within the CNT 120 interspaces using an ALD process or other conformal deposition process, as shown in FIG. 11. The conductive material 136' fills or encapsulates the interspaces of the CNT's 120 shown in FIG. 8, forming encapsulated CNT's 140 shown in FIG. 11. Excess portions of the conductive material 136' and the catalyst 111 are removed from over the top surface of the second insulating material 114 using a CMP process, and a third insulating material 124 is deposited or formed over the second insulating material 114 and the encapsulated CNT's 140. The third insulating material 124 is patterned for a conductive feature 136, and a conductive feature 136 is formed within the pattern, as described for the embodiment shown in FIGS. 9 and 10, e.g., using an ECP process or other process.

Figure 14:
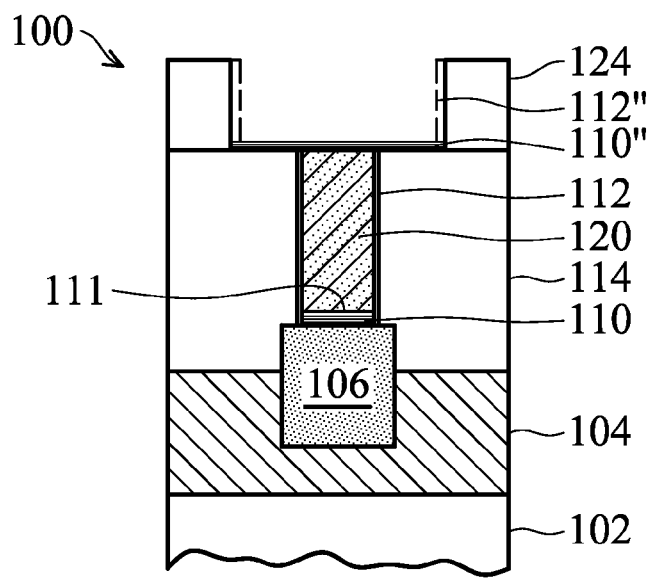
FIGS. 14 and 15 are cross-sectional views of a method of manufacturing a semiconductor device at various stages of manufacturing in accordance with some embodiments.
Figure 15:
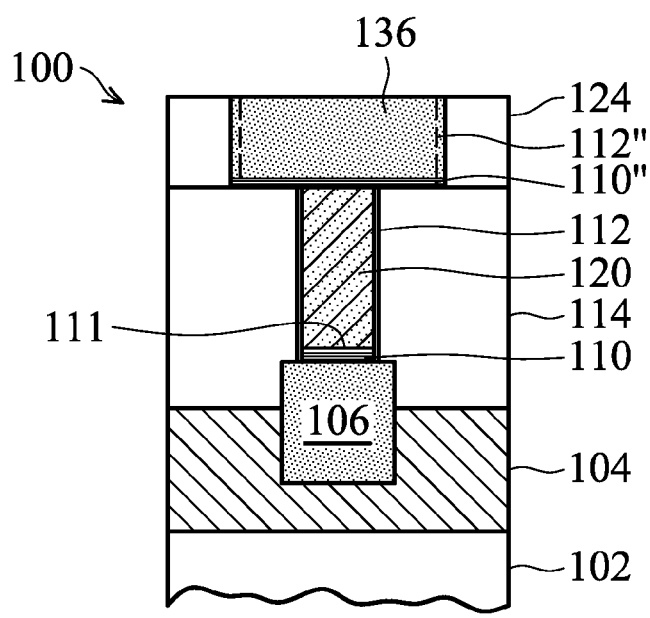

In other embodiments, an additional graphene-based conductive layer 110" is included in the semiconductor device 100, as shown in FIGS. 14 and 15, which are cross-sectional views of a method of manufacturing a semiconductor device 100 at various stages of manufacturing in accordance with some embodiments. The graphene-based conductive layer 110 is also referred to herein as a first graphene-based conductive layer 110, for example. After depositing a third insulating material 124 and patterning the third insulating material 124 with a pattern for a conductive feature 136 as described with reference to FIG. 9, a second graphene-based conductive layer 110" is formed in the bottom of the pattern for the conductive feature 136, as shown in FIG. 14. The second graphene-based conductive layer 110" is formed using PECVD in some embodiments. The second graphene-based conductive layer 110' is formed over a top surface of the plurality of CNT's 120 and over a top surface of a portion of the third insulating material 124.

In other embodiments, the second graphene-based conductive layer 110" is formed using a similar gas-phase growth process used to form the first graphene-based conductive layer 110 and carbon-based adhesive layer 112 as described for the previous embodiments. The carbon-based adhesive layer 112 is also referred to herein as a first carbon-based adhesive layer 112 in some embodiments. Forming the second graphene-based conductive layer 110" results in the formation of a second carbon-based adhesive layer 112" on sidewalls of the patterned third insulating material 124, as shown in phantom in FIG. 14.

A conductive feature 136 is then formed over the second graphene-based conductive layer 110" or over the second graphene-based conductive layer 110" and the second carbon-based adhesive layer 112", if the second carbon-based adhesive layer 112" is included. The conductive feature 136 comprises a second conductive feature 136 that is formed using a similar method described for the previous embodiments and as shown in FIG. 15. In some embodiments, the conductive feature 136 is formed using an ECP process. Other methods described for the previous embodiments may also be used to form the conductive feature 136. The second graphene-based conductive layer 110" is disposed between the CNT 120 and the second conductive feature 136.

Figure 16:
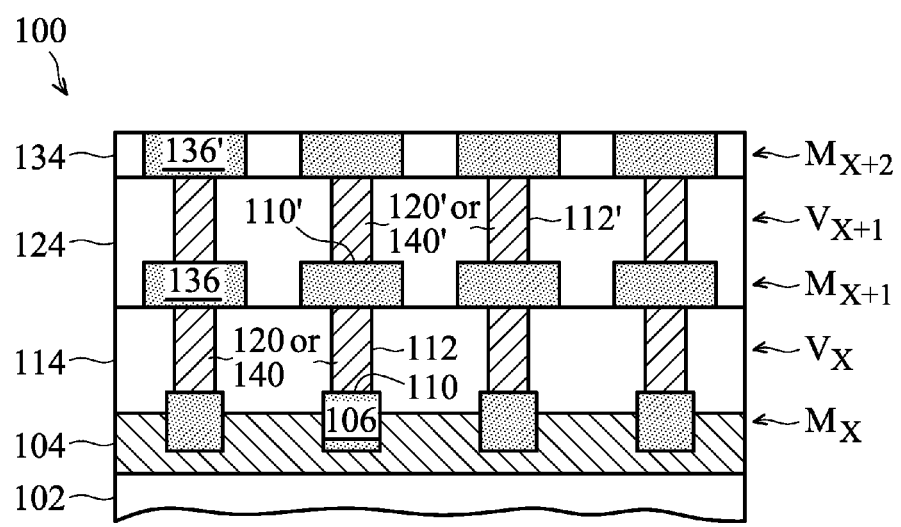
FIG. 16 is a cross-sectional view of a semiconductor device in accordance with some embodiments.

FIG. 16 is a cross-sectional view of a semiconductor device 100 in accordance with some embodiments. A plurality of layers of CNT's 120 and 120' or encapsulated CNT's 140 and 140' are formed in via layers $V_x$ and $V_{x+1}$, respectively, of the semiconductor device 100. Each via layer $V_x$ and $V_{x+1}$ of CNT's 120 and 120' or encapsulated CNT's 140 and 140' is disposed between two conductive line layers $M_x$ and $M_{x+1}$, or $M_{x+1}$ and $M_{x+2}$, respectively. Only two via layers $V_x$ and $V_{x+1}$ and three conductive line layers $M_x$, $M_{x+1}$, and $M_{x+2}$ are shown in FIG. 16; alternatively, many more via layers and conductive line layers may be included in an interconnect structure of the semiconductor device 100. In some embodiments, the interconnect layers comprising via layers $V_x$ and $V_{x+1}$ and conductive line layers $M_x$, $M_{x+1}$, and $M_{x+2}$ are formed in a back-end-of-line (BEOL) process for the semiconductor device 100. A catalyst 111 (not shown in FIG. 16; see FIG. 10) may be disposed between the graphene-based conductive layer 110 and the CNT's 120 or 140. Likewise, a catalyst (not shown) may also be disposed between the graphene-based conductive layer 110' and CNT's 120' or 140', for example.

The embodiment shown in FIG. 16 also illustrates that the conductive features 106 and 136 and CNT's 120 or 120' or encapsulated CNT's 140 or 140' may be formed using dual damascene processes. For example, patterns for conductive features 106 and CNT's 120 or encapsulated CNT's 140 can be formed in a single insulating material 114 using two patterning steps, and the patterned insulating material 114 can be processed and filled using the methods described herein. Likewise, patterns for conductive features 136 and CNT's 120' or encapsulated CNT's 140' can be formed in a single insulating material 124 using two patterning steps, and the patterned insulating material 124 can be processed and filled using the methods described herein. The top layer of conductive features 136' is formed in a single insulating material 134. Alternatively, each via layer $V_x$ and $V_{x+1}$ and each conductive line layer $M_x$, $M_{x+1}$, and $M_{x+2}$ may be formed within a separate insulating material, not shown.

In some embodiments, one of the CNT's 120 comprises a first CNT 120. The semiconductor device 100 includes a plurality of second conductive features 136 and 136' disposed within a plurality of third insulating materials 124 and 134. A second CNT 120' is disposed between each adjacent one of the plurality of second conductive features 136 and 136', as shown in FIG. 16.

Figure 17:
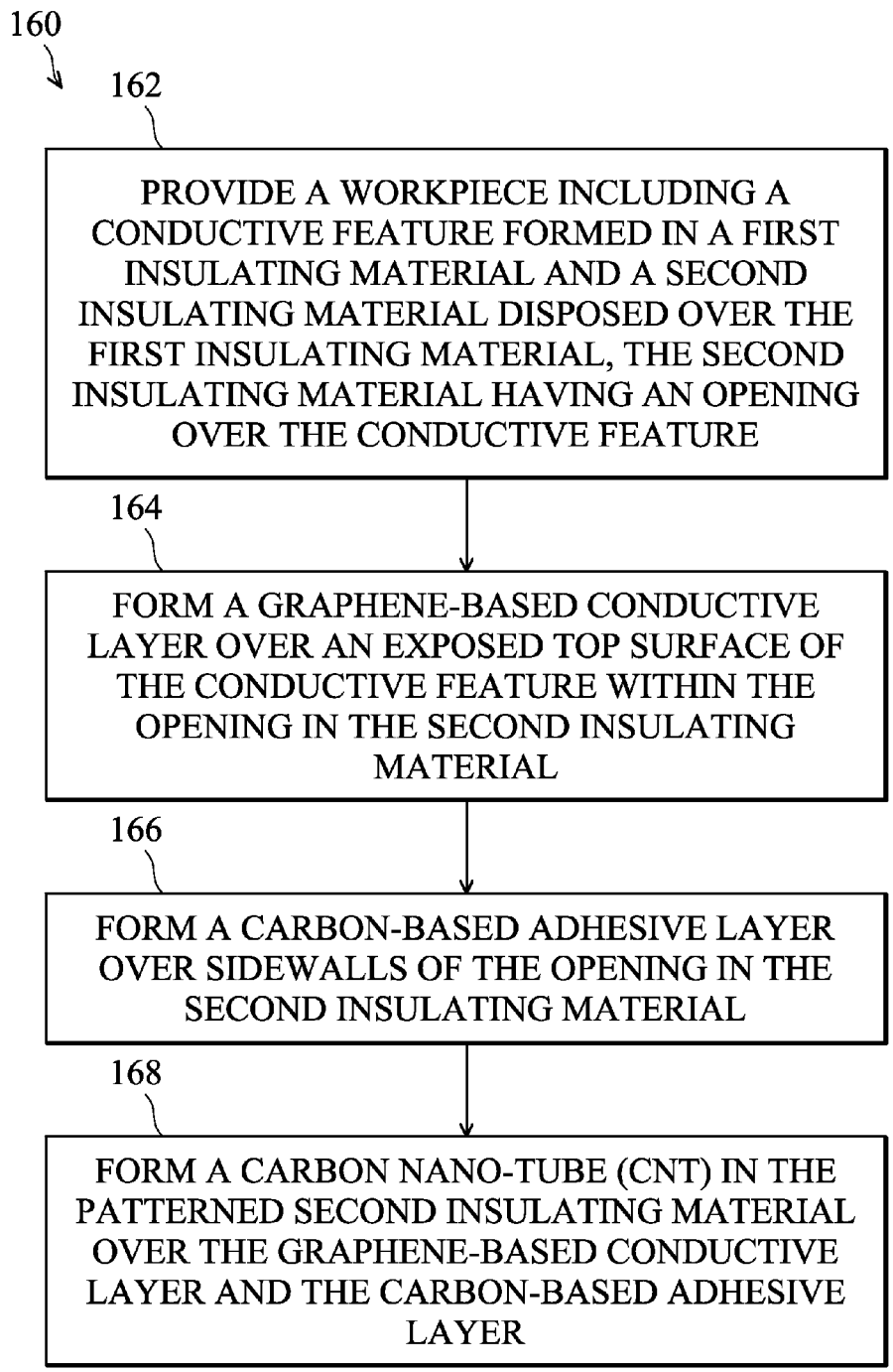
FIG. 17 is a flow chart of a method of manufacturing a semiconductor device in accordance with some embodiments.

FIG. 17 is a flow chart 160 of a method of manufacturing a semiconductor device 100 in accordance with some embodiments, which is also shown in FIGS. 4, 5, and 8. In step 162, a workpiece 102 is provided that includes a conductive feature 106 formed in a first insulating material 104 and a second insulating material 114 disposed over the first insulating material 104, the second insulating material 114 having an opening over the conductive feature 106 (see FIG. 4). In step 164, a graphene-based conductive layer 110 is formed over an exposed top surface of the conductive feature 106 within the opening in the second insulating material 114 (see FIG. 5). In step 166, a carbon-based adhesive layer 112 is formed over sidewalls of the opening in the second insulating material 114 (see also FIG. 5). In step 168, a CNT 120 is formed in the patterned second insulating material 114 over the graphene-based conductive layer 110 and the carbon-based adhesive layer 112 (see FIG. 8).

Some embodiments of the present disclosure include methods of forming semiconductor devices 100, and also include semiconductor devices 100 manufactured using the methods described herein.

Advantages of some embodiments of the disclosure include providing novel semiconductor devices 100 that include CNT's 120 or 140 that include graphene-based conductive layers 110 and carbon-based adhesive layers 112. A novel CNT integration scheme is disclosed, wherein the graphene-based conductive layers 110 reduce a contact resistance of a via interconnect formed from the novel CNT's 120 or 140. Via interconnects formed from the novel CNT's 120 or 140 have an ultra-low contact resistance. Via interconnects including the CNT's 120 or 140 have high current densities, excellent immunity to electromigration (EM), and superior electrical, thermal, and mechanical properties. The formation methods used for the graphene-based conductive layers 110 result in conformal and uniform deposition of the graphene-based conductive layers 110, which subsequently improves the growth process for the CNT's 120 or 140. The simultaneous approach of forming the graphene-based conductive layer 110 and the carbon-based adhesive layer 112 is straightforward, effective, and controllable. In some embodiments, the graphene-based conductive layers 110 function as conductive glue layers that improve film adhesion, resulting in decreased interfacial resistance of the conductive feature 106, graphene-based conductive layer 110, and the CNT's 120 or 140. In some embodiments, synthesis methods used to form the graphene-based conductive layer 110 include CVD, APCVD, LPCVD, PECVD, or ALCVD methods, which are very controllable and economical. Furthermore, the novel semiconductor device 100 structures and designs are easily implementable in manufacturing process flows.

In accordance with some embodiments of the present disclosure, a method of manufacturing a semiconductor device includes providing a workpiece including a conductive feature formed in a first insulating material and a second insulating material disposed over the first insulating material, the second insulating material having an opening over the conductive feature. The method includes forming a graphene-based conductive layer over an exposed top surface of the conductive feature within the opening in the second conductive material, and forming a carbon-based adhesive layer over sidewalls of the opening in the second insulating material. A CNT is formed in the patterned second insulating material over the graphene-based conductive layer and the carbon-based adhesive layer.

In accordance with other embodiments, a method of manufacturing a semiconductor device includes forming a first insulating material over a workpiece, forming a conductive feature in the first insulating material, and forming a second insulating material over the conductive feature and the first insulating material. The method includes patterning the second insulating material to expose a portion of a top surface of the conductive feature, and simultaneously forming a graphene-based conductive layer over the exposed top surface of the conductive feature and a carbon-based adhesive layer on sidewalls of the patterned second insulating material. A plurality of carbon nano-tubes (CNT's) is formed in the patterned second insulating material over the graphene-based conductive layer and the carbon-based adhesive layer.

In accordance with other embodiments, a semiconductor device comprises a workpiece including a conductive feature disposed in a first insulating material and a second insulating material disposed over the first insulating material, the second insulating material having an opening over the conductive feature. A graphene-based conductive layer is disposed over an exposed top surface of the conductive feature within the opening in the second insulating material. A carbon-based adhesive layer is disposed over sidewalls of the opening in the second insulating material. A CNT is disposed within the patterned second insulating material over the graphene-based conductive layer and the carbon-based adhesive layer.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
providing a workpiece including a conductive feature formed in a first opening of a first insulating material and a second insulating material disposed over the first insulating material, the second insulating material being patterned to have a second opening over the conductive feature;
simultaneously forming a graphene-based conductive layer over an exposed top surface of the conductive feature within the second opening in the second insulating material
and a carbon-based adhesive layer over sidewalls of the second opening in the second insulating material; and
forming a carbon nano-tube (CNT) in the patterned second insulating material over the graphene-based conductive layer and the carbon-based adhesive layer.

2. The method according to claim 1, wherein forming the graphene-based conductive layer and forming the carbon-based adhesive layer comprise a gas-phase growth process.

3. The method according to claim 1, wherein forming the graphene-based conductive layer and forming the carbon-based adhesive layer comprise a process selected from the group consisting essentially of chemical vapor deposition (CVD), atmospheric pressure CVD (APCVD), low-pressure CVD (LPCVD) at a sub-atmospheric pressure, plasma enhanced CVD (PECVD), atomic layer CVD (ALCVD), and combinations thereof.

4. The method according to claim 1, wherein forming the graphene-based conductive layer comprises forming a plurality of graphene sheets (GS's).

5. The method according to claim 1, wherein forming the carbon-based adhesive layer comprises forming amorphous carbon.

6. The method according to claim 1, wherein forming the graphene-based conductive layer comprises forming a first graphene-based conductive layer, and wherein the method further comprises forming a second graphene-based conductive layer on a top surface of the CNT.

7. The method according to claim 1, wherein the conductive feature is formed by a damascene process or a subtractive etch process.

8. A method of manufacturing a semiconductor device, the method comprising:
forming a first insulating material over a workpiece;
forming a conductive feature in the first insulating material;
forming a second insulating material over the conductive feature and the first insulating material;
patterning the second insulating material to expose a portion of a top surface of the conductive feature;
simultaneously forming a graphene-based conductive layer over the exposed top surface of the conductive feature and a carbon-based adhesive layer on sidewalls of the patterned second insulating material; and
forming a plurality of carbon nano-tubes (CNT's) in the patterned second insulating material over the graphene-based conductive layer and the carbon-based adhesive layer.

9. The method according to claim 8, wherein forming the conductive feature comprises a damascene process or a subtractive etch process.

10. The method according to claim 8, wherein simultaneously forming the graphene-based conductive layer and the carbon-based adhesive layer comprises using $CH_4+H_2+Ar$.

11. The method according to claim 8, wherein forming the plurality of CNT's comprises forming a via interconnect.

12. The method according to claim 11, wherein forming the graphene-based conductive layer reduces a contact resistance of the via interconnect.

13. The method according to claim 8, wherein the conductive feature comprises a first conductive feature; wherein the method further comprises forming a third insulating material over the plurality of CNT's and the second insulating material, patterning the third insulating material to form an opening over top surfaces of each of the plurality of CNT's, and forming a conductive material in the patterned third insulating material; and wherein the conductive material in the patterned third insulating material comprises a second conductive feature.

14. The method according to claim 8, further comprising forming a conductive material over the second insulating material and the plurality of CNT's, and wherein forming the conductive material comprises encapsulating the plurality of CNT's with the conductive material.

15. A method of manufacturing a semiconductor device, the method comprising:
forming a patterned conductive feature in a first insulating material;
forming a second insulating material over the first insulating material and the patterned conductive feature;

patterning the second insulating material to form a second opening having sidewalls therein, the second opening exposing a portion of the patterned conductive feature;

simultaneously depositing a graphene-based conductive layer on exposed portion of the conductive feature and a carbon-based conductive layer on the sidewalls of the second opening;

depositing a catalyst on the graphene-based conductive layer; and growing within the second opening a carbon nano-tube.

16. The method of claim 15, further comprising growing a plurality of carbon nano-tubes within the second opening.

17. The method of claim 16, further comprising filling interspaces between the carbon nano-tubes with metal.

18. The method of claim 15, wherein the step of simultaneously depositing a graphene-based conductive layer on exposed portion of the conductive feature and a carbon-based conductive layer on the sidewalls of the second opening comprises a gas-phase growth process using a $CH_4$ precursor.

19. The method of claim 15, wherein the step of depositing a catalyst on the graphene-based conductive layer comprises depositing Fe on the graphene-based conductive layer, but not on the carbon-based adhesive layer.

20. The method of claim 15, wherein the carbon-based conductive layer and the graphense-based conductive layer are simultaneously formed in a chamber wherein a gas flow of $CH_4+H_2+Ar$ is introduced.

* * * * *